US007515021B2

(12) United States Patent
Kalinin et al.

(10) Patent No.: US 7,515,021 B2

(45) Date of Patent: Apr. 7, 2009

(54) SPLIT-RING COUPLER INCORPORATING DUAL RESONANT SENSORS

(75) Inventors: Victor Alexandrovich Kalinin, Headington (GB); John Peter Beckley, Bicester (GB)

(73) Assignee: Transense Technologies PLC (GB)

(*) Notice: Subject to any disclaimer, the term of this patent is extended or adjusted under 35 U.S.C. 154(b) by 224 days.

(21) Appl. No.: 11/587,455

(22) PCT Filed: Apr. 15, 2005

(86) PCT No.: PCT/GB2005/001474

§ 371 (c)(1),
(2), (4) Date: Oct. 24, 2006

(87) PCT Pub. No.: WO2005/104292

PCT Pub. Date: Nov. 3, 2005

(65) Prior Publication Data

US 2008/0061910 A1 Mar. 13, 2008

(30) Foreign Application Priority Data

Apr. 26, 2004 (GB) ................................ 0409251.6

(51) Int. Cl.
*H01P 1/06* (2006.01)
*H03H 9/00* (2006.01)
*H01P 5/12* (2006.01)

(52) U.S. Cl. ..................................... 333/261; 333/24 R

(58) Field of Classification Search ................. 333/261, 333/24 R, 32, 24 C
See application file for complete search history.

(56) References Cited

U.S. PATENT DOCUMENTS

| | | | | |
|---|---|---|---|---|
| 1,233,553 | A | 7/1917 | Coover | |
| 4,089,049 | A | 5/1978 | Suzuki | |
| 4,118,670 | A | 10/1978 | Dickens | |
| 4,242,666 | A | 12/1980 | Reschovsky | |
| 4,730,224 | A * | 3/1988 | Komatsu | 360/64 |
| 5,192,923 | A | 3/1993 | Komatsu | |
| 6,437,656 | B1 * | 8/2002 | Guynn et al. | 333/24 R |
| 6,864,759 | B2 * | 3/2005 | Lonsdale et al. | 333/116 |
| 2003/0174062 | A1 | 9/2003 | Lonsdale | |

FOREIGN PATENT DOCUMENTS

GB 2328086 2/1999

(Continued)

OTHER PUBLICATIONS

Steinberg et al., Study of the Impact of a Non-Contact Coaxial Rotating joint on measuring the frequency of the Surface Acoustic Wave Resonator Connected Thereto; XII Int'l Conference on Spin Electronics and Gyrovector Electrodynamics; Dec. 2003; 11 pages.

*Primary Examiner*—Dean O Takaoka
(74) *Attorney, Agent, or Firm*—Keusey, Tutunjian and Bitetto, P.C.

(57) ABSTRACT

A split ring coupler comprising a stator ring having at least one split in it such that the stator has at least a first and a second end and a rotor ring having at least one split in it such that the rotor ring has at least a first and a second end, said rotor ring being oriented substantially coaxially with and axially spaced apart from said stator ring. At least one SAW resonator is electrically directly coupled between said first and second ends of the rotor ring in series therewith, neither of said ends of said stator ring being connected to ground.

20 Claims, 9 Drawing Sheets

FOREIGN PATENT DOCUMENTS

| | | |
|---|---|---|
| GB | 2368470 | 5/2002 |
| GB | 2371414 | 7/2002 |
| JP | 63-220401 | 9/1988 |
| WO | WO 96/37921 | 11/1996 |
| WO | WO 01/33180 | 5/2001 |
| WO | WO 02/19457 | 3/2002 |

* cited by examiner

SPLIT-RING COUPLER INCORPORATING DUAL RESONANT SENSORS

CROSS REFERENCE TO RELATED APPLICATIONS

This application claims the benefit of PCT Application No. PCT/GB2005/001474, filed Apr. 15, 2005, and GB Application 0409251.6, filed Apr. 26, 2004, both of which are herein incorporated by reference.

BACKGROUND OF THE INVENTION

1. Field of the Invention

The present invention relates to electromagnetic couplings, and in particular, a contactless rotary coupler.

The objective is to suggest a design of a rotary coupler working at UHF, in particular in the 400-500 MHz frequency range, that provides a contactless link between one or two resonant sensors installed on the two opposite sides of the rotating shaft and the stationary electronic interrogation unit. The coupler should ensure (a) a maximum amplitude of the resonant sensor response seen at the stator input of the coupler, (b) a minimum variation of the response amplitude and (c) a minimum variation of the resonant frequencies of the sensors with the rotation angle.

2. Description of the Related Art

1. Racal patent WO 96/37921 (hereinafter, Racal)

The patent discloses a rotary coupler that is based on a quarter-wave coupled-line directional coupler (see FIG. 1*a*), a well-known four-port microwave device. The difference between it and the proposed coupler is that the coupled transmission lines of the latter are not linear but annular (FIG. 1*b*) with the circumference close to λ/4 (or 0.62λ/4 to minimize phase and amplitude variation of $S_{41}$ with the rotation angle).

In order to achieve a total power transfer from port 1 of the stator ring 10 to port 4 of the rotor ring 20, the quarter-wave 3 dB coupler can be loaded as shown in FIG. 2*a*. Ports 2 and 3 are short-circuited and the output port 4 is loaded by $Z=Z_0$ where $Z_0$ is the characteristic impedance of the external circuit. It is important to note that the load Z is always connected between the end of the strip and the ground plane (it is not shown in the figures) because the transmission line ports are defined this way.

The rotary RF or microwave coupler is needed for a torque sensor based on Surface Acoustic Wave (SAW), STW and FBAR resonators or other types of resonant structures sensitive to strain on the shaft surface. It can also be used to do temperature measurements and other types of measurements on rotating shafts. We are interested only in the sensor application of the rotary coupler although it is widely used in other areas (e.g. radars). Further on we shall use the term SAW sensor to denote any type of the resonant structure sensitive to physical quantities of interest. The aim of the interrogation unit is to measure die resonant frequency of the SAW sensor. If the sensor 30 is connected to the rotor ring instead of the load Z as shown in FIG. 2*b* then the interrogator can easily “see” the resonant peak in $S_{11}$, the frequency response at the stator port 1, and do the frequency measurement.

For the sensor application, it is not essential to have a strictly defined amount of coupling between the stator and the rotor rings (3 dB coupling, for instance) and a strictly defined circumference length of the coupler (λ/4 for instance) in order to be able to measure the resonant frequency at port 1. The resonant peak in $S_{11}$ exists within a wide range of the coupler geometrical parameters but its amplitude and position depend to a large extent on the geometry of the coupler disclosed in the Racal patent. For some shaft diameters and frequencies it is quite difficult to obtain a well-pronounced resonant peak at any rotation angle.

For sensor applications two aspects are important:

(a) the amplitude of the resonant peak in $S_{11}$ should be as large as possible and (b) the variation of the amplitude and the position of the resonant peak in $S_{11}$ with the rotation angle should be as small as possible.

Transense patents quoted below are devoted to the solution of this problem.

2. Transense patent application GB 2328086 (hereinafter, Transense ’086)

This application differs from the Racal patent by the addition of the trimming capacitor between the terminals 1 and 2 of the stator ring in order to slightly broaden the coupler bandwidth and reduce the angular variation of the resonant frequency seen at port 1. The SAW sensor is connected between the terminal 4 of the rotor ring and the ground as shown in FIG. 2*b*. If the sensor contains more than one SAW resonator then each of them should be connected to a separate rotor ring coupled to a separate stator ring. According to this application, all the stator and rotor rings can be on the same stator and rotor boards. However, being concentric they will have different diameters and as a result the resonant peaks seen at the stator inputs will vary differently with the rotation angle. As a consequence measuring the difference between the resonant frequencies will not allow efficient cancelling of the angular frequency variation.

3. Transense patent application GB 2368470 (hereinafter, Transense ’470)

This application discloses a coupler similar to that described in the previous patent application. In fact it consists of two Racal-type couplers each forming not a full circle but just half a circle and connected in parallel. This allows using the coupler with the shafts of a larger diameter so that the total coupler circumference is larger than λ/4. The SAW sensor is again connected between the stripline end and the ground plane.

4. Transense patent application 2371414 (hereinafter, Transense ’414)

The coupler disclosed in this application is not based on electro-magnetically coupled transmission lines as it was in all previous patents. It utilises two purely magnetically coupled loops with the grounded electric screen between them that prevents a coupling by means of electric field. This coupler should work all right at low frequencies where the circumference is considerably shorter than the wavelength. At higher frequencies, due to the absence of ground planes on both sides of the coupler and poor field confinement, there will be considerable radiation losses and the coupler will also be susceptible to interference. Small signal amplitude at the input of the stator can also be problematic for this coupler.

5. Paper by O. Shteinberg and S. Zhgoon (hereinafter, Shteinberg)

The paper describes the coupler consisting of two annular coupled transmission lines as shown in FIG. 2*c* The SAW resonator connected between the terminals 3 and 4 instead of being connected between terminal 4 and ground as it is in Transense ’470.

SUMMARY OF THE INVENTION

According to a presently preferred embodiment of the invention, there is provided a spilt ring coupler comprising a split stator ring having first and second ends, a split rotor ring having first and second ends, said rotor ring being oriented substantially coaxially with and axially spaced apart from some stator ring, and at least one saw resonator electrically coupled between said first and second ends of the rotor ring, wherein neither of said ends of said stator ring are directly connected to ground.

In use, one of the ends of the stator ring is coupled to a signal analysis means such as a network analyser or other electronic component. In a preferred embodiment, the other end of the stator ring is coupled to earth through a resistor, the value of which may be varied for different applications. It has, though, been found to be advantageous for the value of the resistor to be greater than the characteristic impedance of the signal line. In another embodiment, said other end may be left open circuit, that is effectively with an infinite resistance attached thereto.

More particularly, the at least one SAW resonator is connected between the first and second ends of the rotor ring, that is in series therewith. A plurality of resonators may alternatively be connected to said rotor ring. In one embodiment, a plurality of resonators are connected in parallel with each other and in series with rotor ring, that is one contact of each resonator is connected to the first end of the rotor ring and the other contact of each resonator is connected to the second end of the rotor ring.

In a further development of the present invention, the rotor ring may be formed as a double split ring so as to be divided into two distinct arcuate sections separated by two split portions, each end of each arcuate section being associated with one end of the other arcuate section. At least one SAW resonator is then coupled between each pair of associated ends of the two arcuate sections, so as to form a rotor ring having two resonators or resonator assemblies each being coupled in series with the two arcuate sections of the rotor ring as well as with each other. Of course, it will be understood that for each end pair, a plurality of SAW resonators may be connected in parallel with each other and in series with the rotor ring. It will also be understood that the rotor ring may be sub-divided into more than two sections with at least one SAW device coupled in series between neighbouring sections of the rotor ring.

BRIEF DESCRIPTION OF THE DRAWINGS

Embodiments of the present invention will now be described with reference to the accompanying drawings, in which.

DETAILED DESCRIPTION OF THE PREFERRED EMBODIMENTS

Figure 3A:
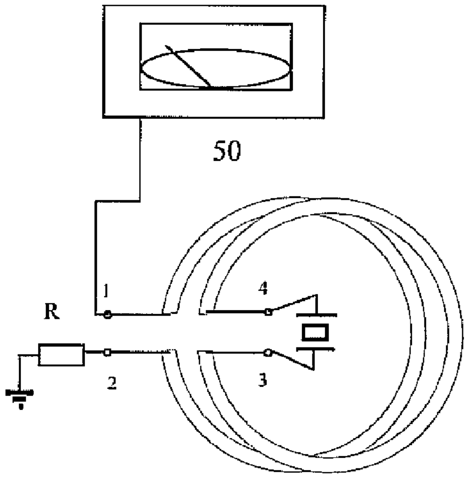
FIG. 3*a* is a schematic diagram illustrating an exemplary embodiment of rotary coupler with a SAW sensor as contemplated by the present principles.

The first embodiment of the suggested coupler is shown in FIG. 3*a*. It is used to couple a single sensor containing a single resonator that is attached to the rotating shaft and the stationary interrogator, or single analysis means comprising a network analyzer (50) connected to the port 1. The interrogator performs either a continuous tracking of the resonant frequency seen at port 1 as it is disclosed in the Transense patent GB0518900 or Transense patent application GB0308728.5 or a pulsed interrogation similar to what was disclosed in Transense patent application GB0120571.5. In both cases the important characteristic is the resonant peak in the frequency response of $S_{11}$.

Figure 3B:
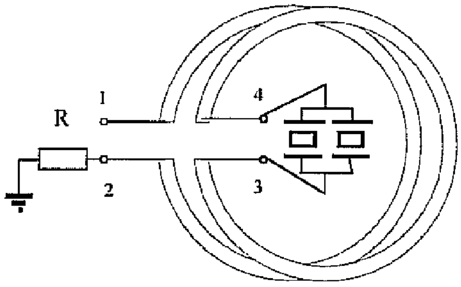
FIG. 3*b* is a schematic diagram illustrating an alternative exemplary embodiment of rotary coupler with a SAW sensor as contemplated by the present principles.
Figure 3C:
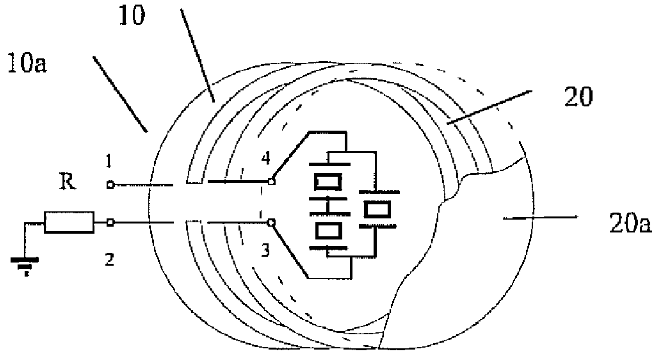
FIG. 3*c* is a schematic diagram illustrating an alternative exemplary embodiment of the rotary coupler.

Similar to the couplers disclosed in the abovementioned prior art documents, namely, Racal, Transense '086 and Transense 470, the proposed coupler consists of two microstrip split rings, the stator ring and the rotor ring, with a certain gap of about 0.5-2 mm between them. Both of them form electro-magnetically coupled transmission lines with their respective ground planes (not shown in FIGS. 3*a*-3*b*). Each ring has a single split thus forming four ports 1-4. The main difference between the proposed coupler and the abovementioned couplers is that the resonant sensor is connected not between the end of the microstrip and the ground plane but between two neighbouring ends of the microstrip line representing the rotor ring. In other words, the SAW resonator is connected in series with the split ring instead of being connected in parallel to one of its ends. There may be a situation when the sensor consists of two SAW resonators with two different resonant frequencies connected either in series or in parallel to each other (one of them is used as a reference, for instance). For example, the SAW resonators can include resonators connected in series with each other and in parallel with other resonators as shown in FIG. 3*c* In this case the sensor can still be connected in series with the rotor split ring as shown in FIG. 3*b* disclosing the second embodiment of the invention. In principle, the sensor can contain any number of the resonators having different resonant frequencies. They can still be interrogated at port 1 either by a corresponding number of the continuous frequency tracking loops or by a single pulsed interrogator as described in GB0308728.5 or GBO 120571.5 respectively.

Figure 4A:
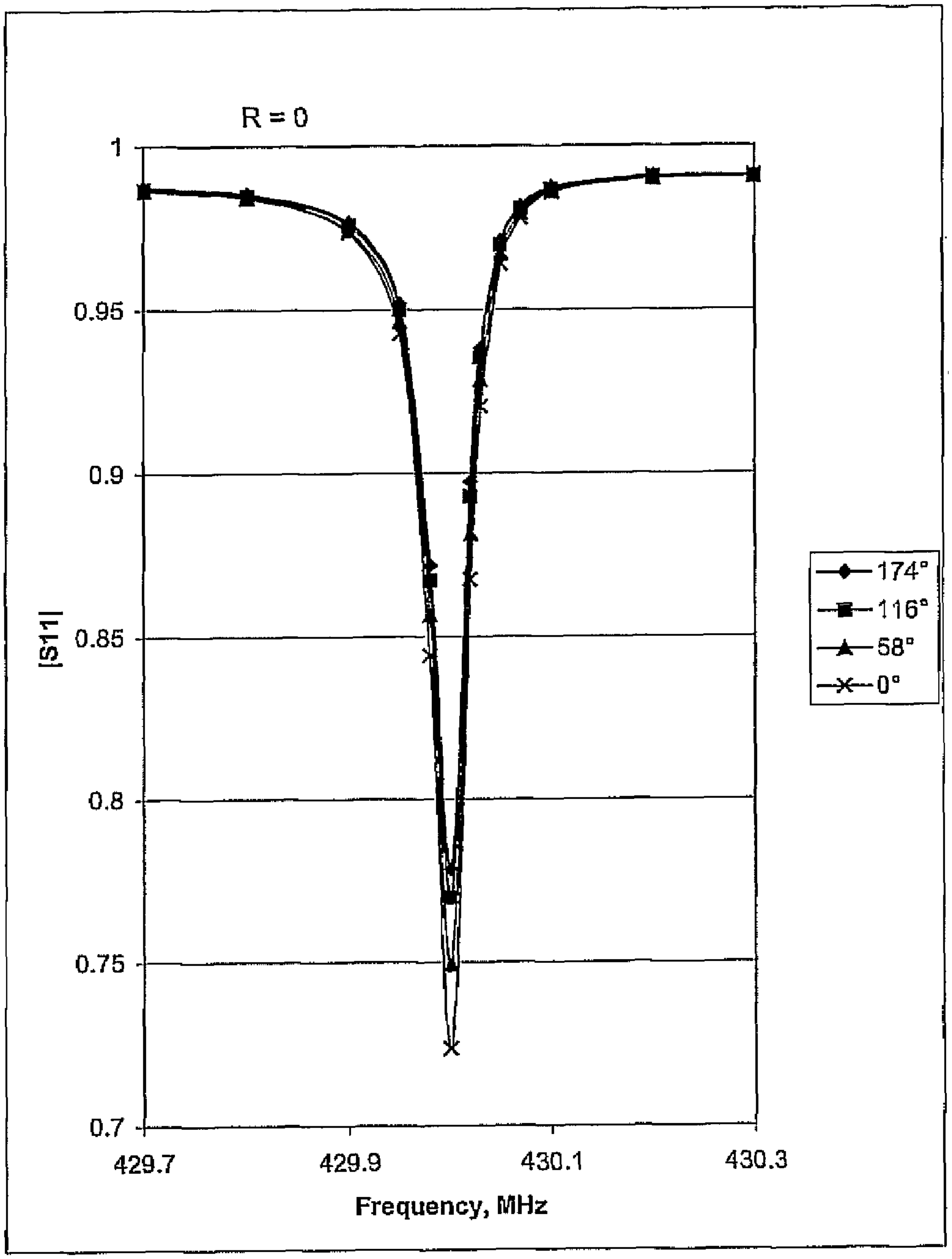
FIG. 4*a* is a chart illustrating the frequency response of the coupler with the resonator and no resistor.
Figure 4B:
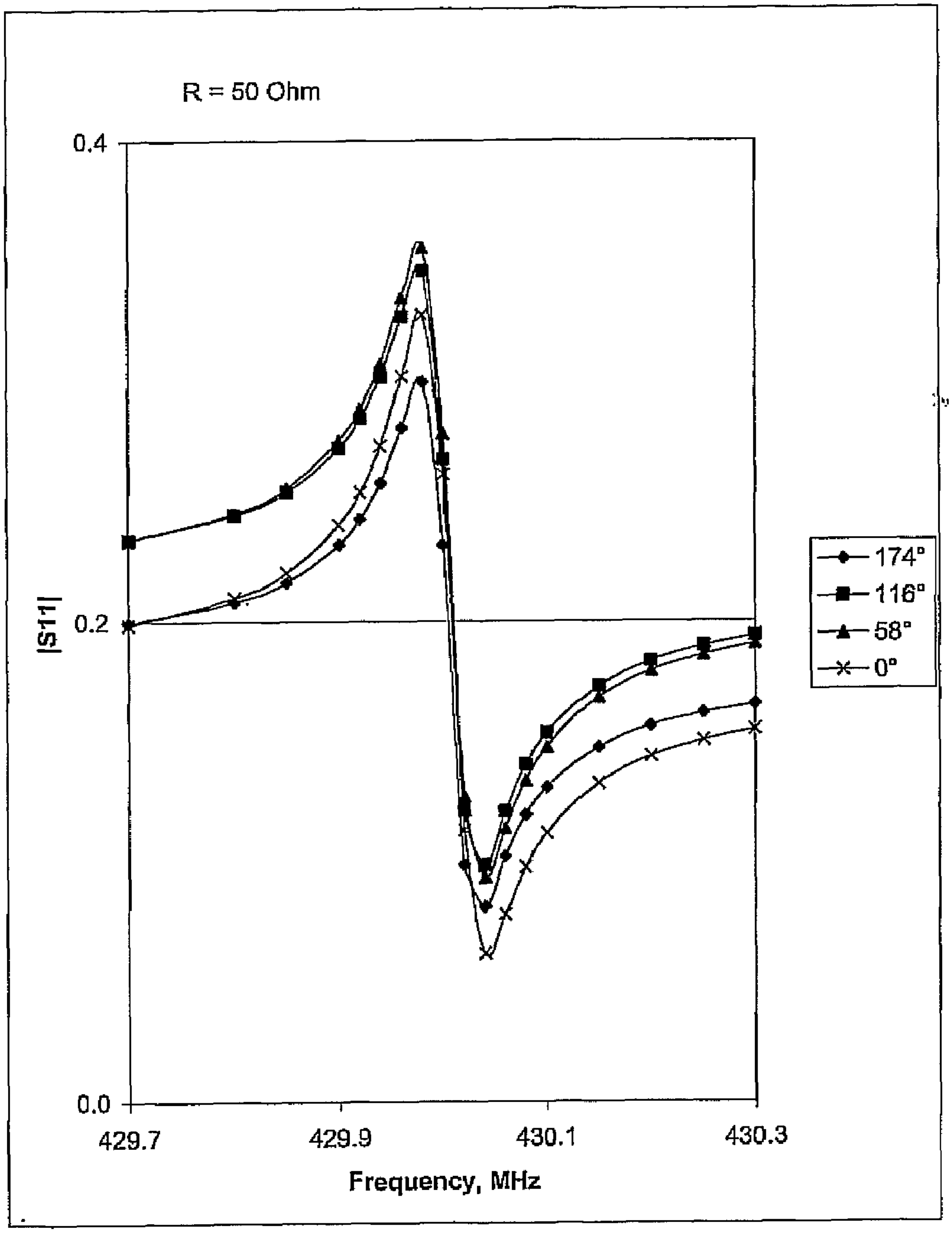
FIG. 4*b* is a chart illustrating the frequency response of the coupler with the resonator with a 50 Ohm resistor.
Figure 4C:
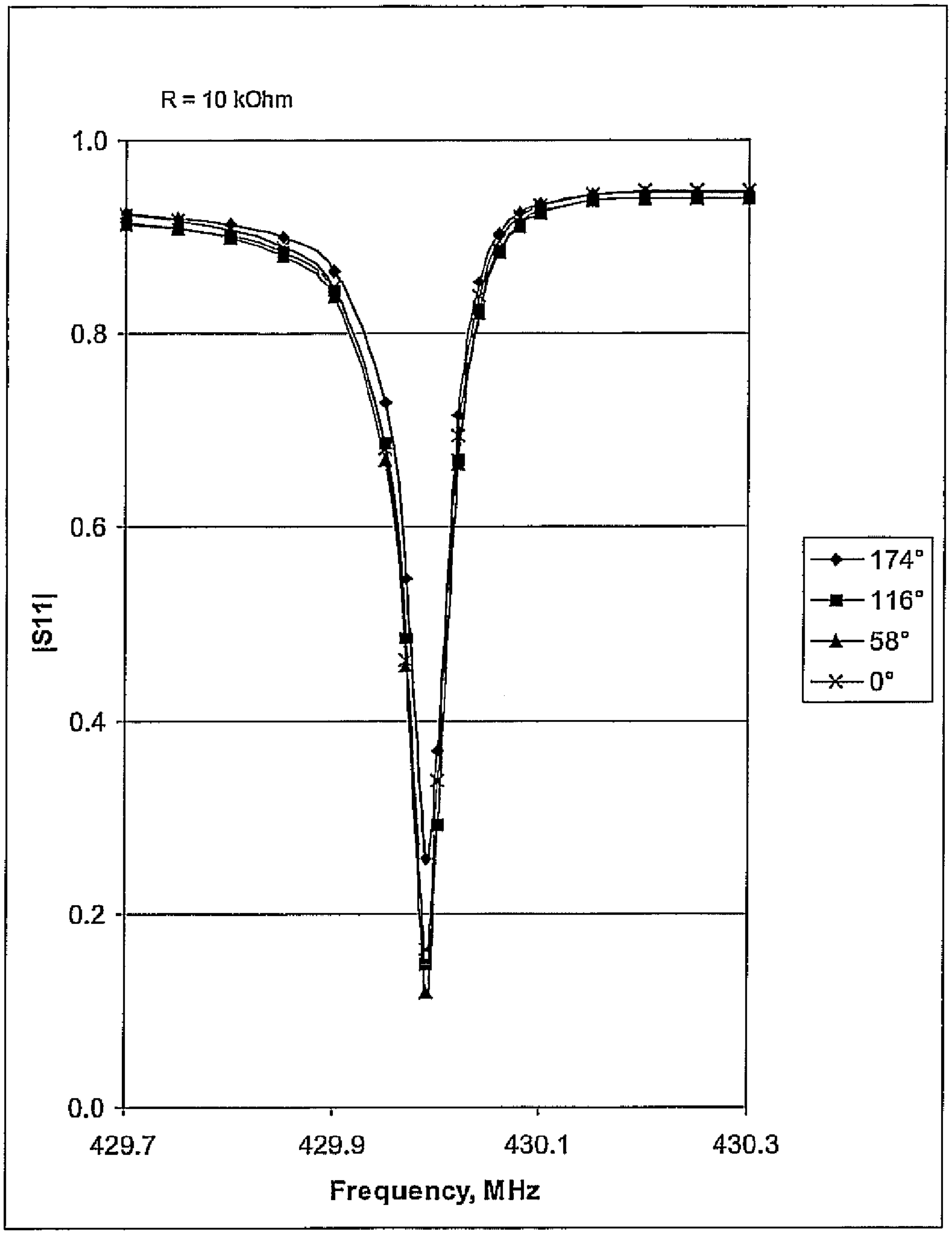
FIG. 4*c* is a chart illustrating the frequency response of the coupler with the resonator with a 10 kOhm resistor.
Figure 5:
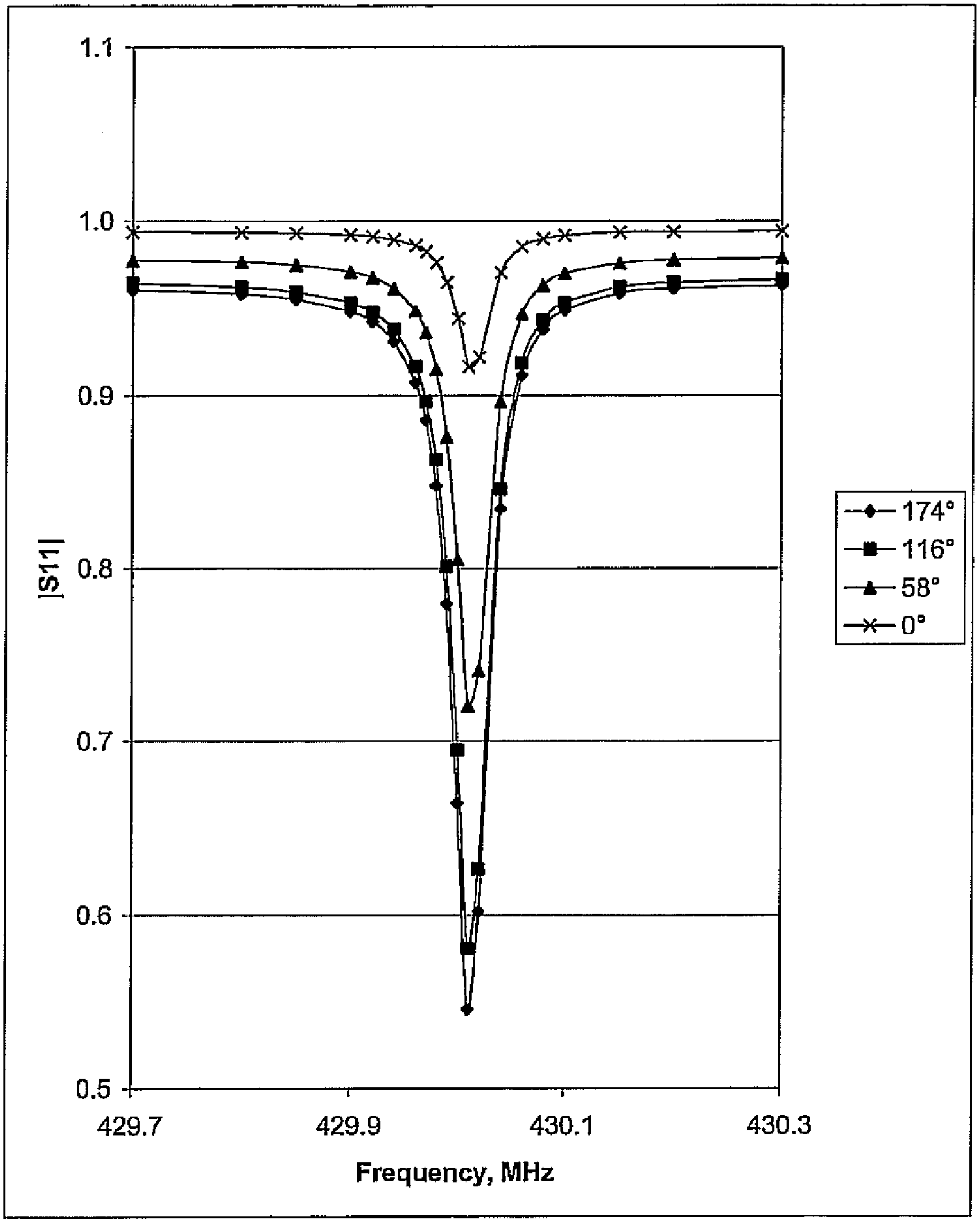
FIG. 5 is a chart illustrating the frequency response of the ordinary coupler presented in FIG. 2*b*.

Another difference is that the port 2 of the stator ring is loaded in the general case by a resistor R. By varying the value of the resistor, the frequency response of the coupler with the resonator can be adjusted in such a way that the resonant peak in $S_{11}$ has sufficiently high amplitude and at the same time acceptable amount of angular variation of its amplitude and position. The latter can be seen from FIGS. 4*a*-4*c* where $|S_{11}|$ is plotted against frequency in the vicinity of one of the resonant frequencies for different values of the rotation angle in three cases: R=0 (as it is in Shteinberg), R=50Ω and R=Ω. The split rings have the following parameters: the line width is 2.4 mm, the substrate thickness is 1.6 mm, the substrate dielectric constant is 4.7, the gap is 1 mm and the diameter is 19.8 mm that corresponds to the coupler circumference of 0.524λ at resonance. Both of the SAW resonators have unloaded Q=12000, the series resonant impedance 49Ω and the static capacitance 1.9 pF. As one can see from the graphs the signal amplitude is smallest for the short-circuited port 2 of the stator ring (as it is in Shteinberg) then it increases with the increase of the value of R. The amount of the peak amplitude and position variation with the angle is minimal at R=0 (0.6 kHz) and R>>50Ω (1.8 kHz) and maximal at R=50Ω (7.8 KhZ). For a comparison, FIG. 5 shows the frequency response of the ordinary coupler presented in FIG. 2*b* having the same parameters. As one can see the signal amplitude in this case is at least two times smaller than for the proposed coupler at R=10 kΩ, the peak amplitude variation is much larger and the peak position variation (1.5 kHz) is comparable. Open circuit instead of a large value resistor can also be used.

Figure 1A:
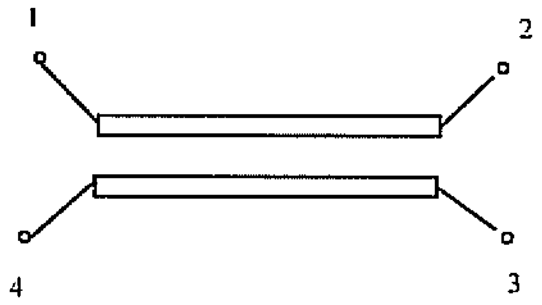
Fig. 1a Prior Art
FIG. 1*a* is a schematic diagram illustrating a rotary coupler that is based on a quarter-wave coupled-line directional coupler well known in the prior art as a four-port microwave device.
Figure 1B:
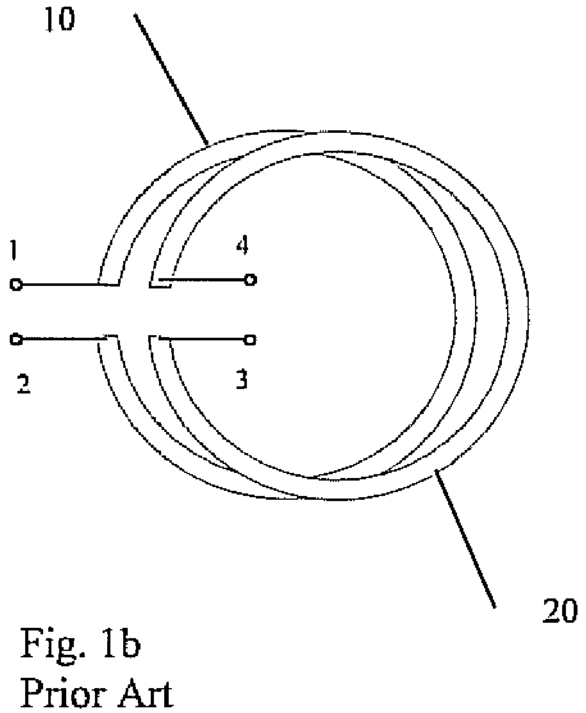
Fig. 1b Prior Art
FIG. 1*b* is a schematic diagram illustrating a rotary coupler known to the prior art, the rotary coupler having linear coupled transmission lines.
Figure 2A:
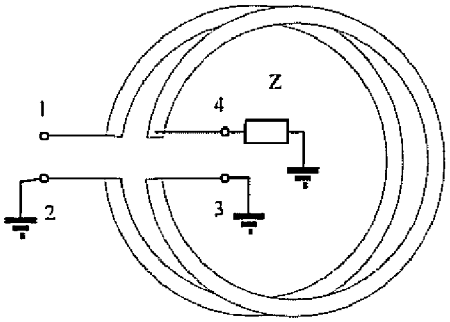
Fig. 2a Prior Art
FIG. 2*a* is a schematic diagram illustrating a rotary coupler where the output port is loaded with a characteristic external load as known to the prior art.
Figure 2B:
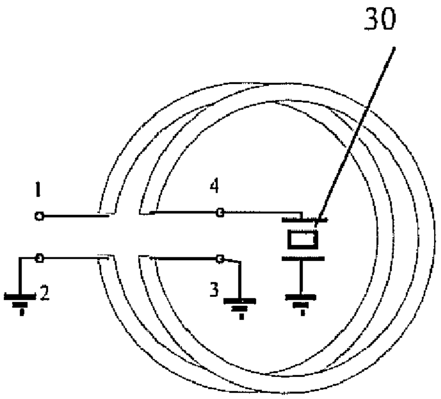
Fig. 2b Prior Art
FIG. 2*b* is a schematic diagram illustrating a rotary coupler with a SAW sensor disposed between the output port and ground as known to the prior art.
Figure 6:
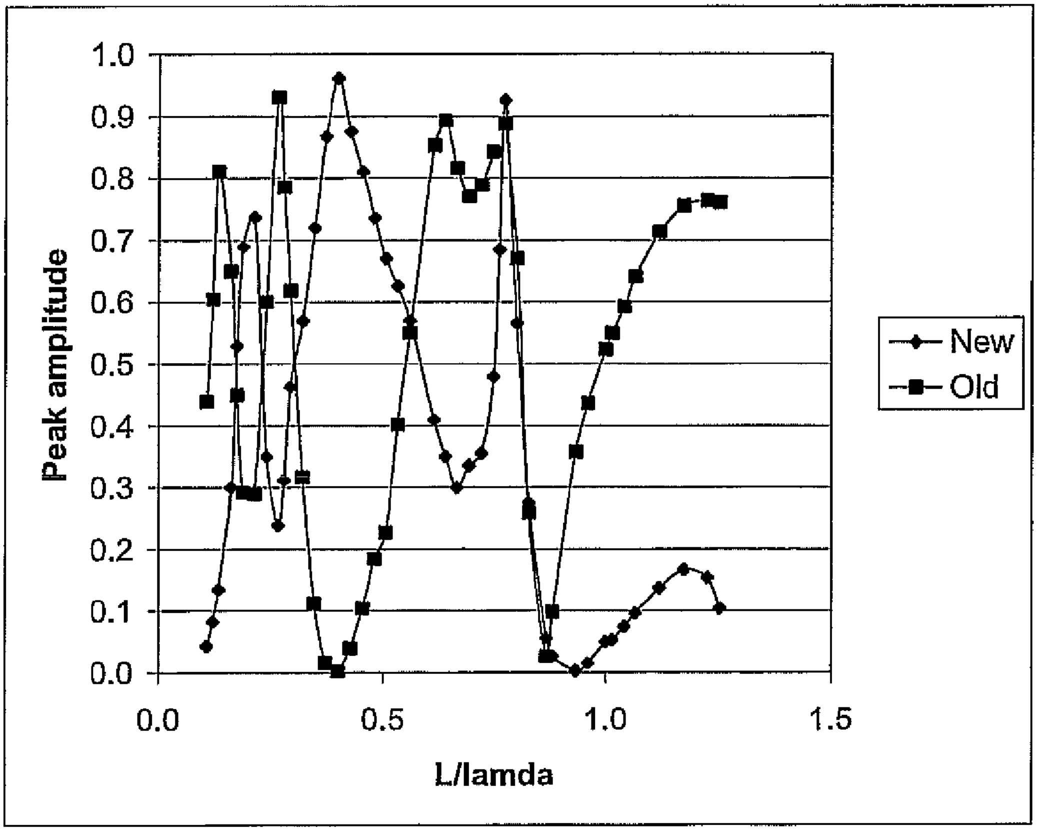
FIG. 6 is a chart illustrating the amplitude of the resonant peak seen at port 1 against the circumference length expressed in wavelengths.

The new coupler shown in FIGS. 3*a*-3*b* is more suitable for work with larger diameters of the shafts than the old coupler disclosed in Racal and Transense '086 (see FIG. 2*b*). As one can see from FIG. 6 presenting the amplitude of the resonant peak seen at port 1 against the circumference length expressed in wavelengths there is a wide maximum of the amplitude around L=0.63λ for the new coupler (for R=10 kΩ). At 430 MHz it corresponds to the coupler diameter of 48 mm which is a very convenient size for the shafts having diameters from 15 mm to 20 mm typical for many automotive applications (e.g. torque sensor for EPAS). The old coupler would have maximum peak amplitudes for the coupler diameters 16 mm, 32 mm, and 80 mm. The first two sizes are too small and the last one is too big.

The difference between the first embodiment shown in FIG. 3*a*, and the design disclosed in Transense '414 is that the stator and the rotor rings are not just magnetically coupled loops. They are electro-magnetical1y coupled transmission lines. Each of them has its own ground plane 1O*a* and 20*a* confining electro-magnetic field and reducing radiation as shown in FIG. 3*c*. It is also easier to achieve sufficiently high amplitude of the resonant peak at the coupler input for this design.

Figure 2C:
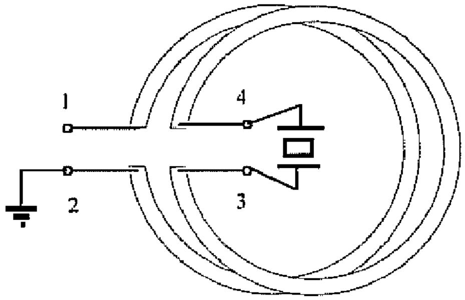
Fig. 2c Prior Art
FIG. 2*c* is a schematic diagram illustrating a rotary coupler consisting of two annular coupled transmission lines with the SAW resonator connected between the terminals 3 and 4, as known to the prior art.

The difference between the first embodiment shown in FIG. 3*a* and the design disclosed in Shteinberg shown in FIG. 2*c* is that the terminal 2 of the stator ring is not short-circuited. Instead, it is either open-circuited or loaded by the resistor R which value is selected to optimize the signal amplitude and the amount of angular variation of the resonant frequency seen at the terminal 1. For a fixed circumference length of the coupler, the presence of R gives the designer one more degree of freedom that helps achieving larger amplitude of the resonant peak seen at the terminal 1.

Figure 7:
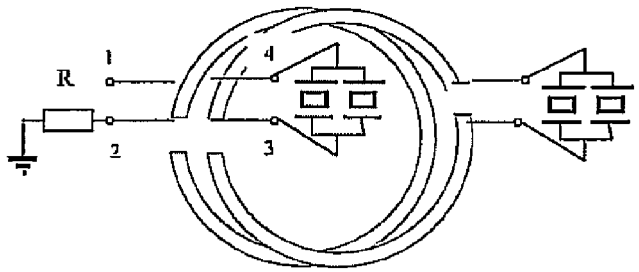
FIG. 7 is a schematic diagram illustrating an alternative exemplary embodiment of rotary coupler with a SAW sensor as contemplated by the present principles.
Figure 8:
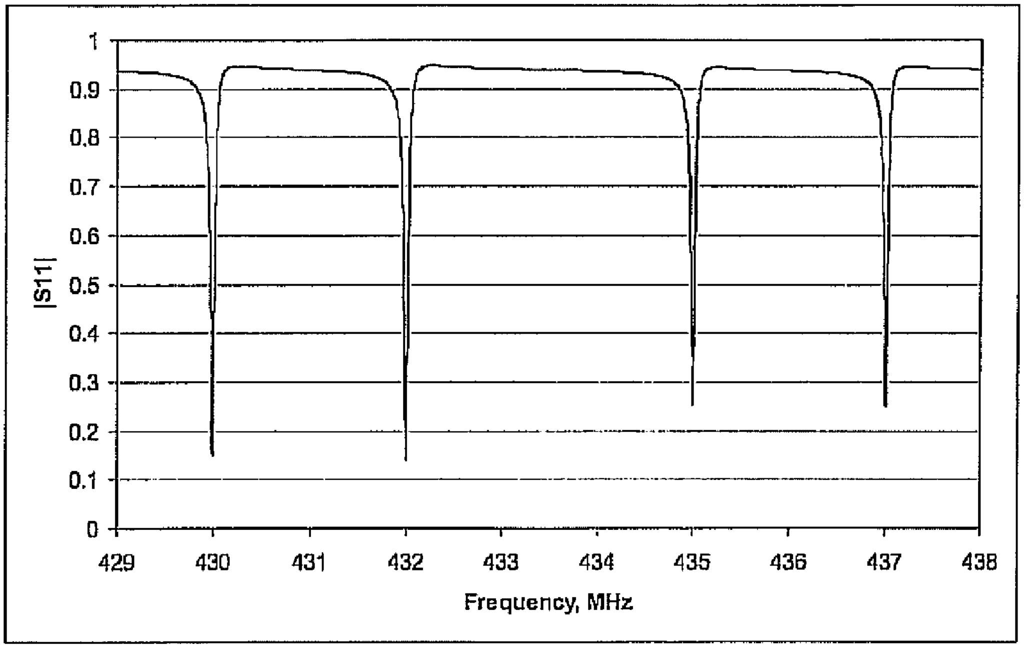
FIG. 8 is a chart illustrating the frequency response of the coupler in the case of two SAW resonators in each of the sensing elements as contemplated by the present principles.

The third embodiment of the coupler is shown in FIG. 7. Very often the torque sensor should be completely insensitive to bending of the shaft. Bending compensation can be achieved if the two sensing elements are attached to the opposite sides of the shaft and the average between the two torque readings is taken. In principle, both resonant sensors can be connected in parallel to port 4 of the old coupler shown in FIG. 2*b*. In this case either long bonding wires or additional microstrip lines need to be used. In both cases they modify the impedance of the SAW resonators and additional matching circuits may be required. The rotor design greatly simplifies if the two resonant sensors are connected in series within the two splits of the rotor ring as shown in FIG. 7. The presence of the second sensor on the opposite side of the shaft does not influence the performance of the first sensor if there is a reasonable separation between the two resonant frequencies. In FIG. 8 one can see an example of the frequency response of the coupler in the case if there are two SAW resonators in each of the sensing elements. The first sensing element contains the resonators working at 430 and 432 MHz and the second sensing element contains resonators working at 435 and 437 MHz.

If needed, more than two sensing elements can be connected in series within more than two splits of the rotor ring.

The invention claimed is:

1. A split ring coupler comprising:

a stator ring having at least one split in it such that the stator has at least a first and a second end;

a rotor ring having at least one split in it such that the rotor ring has at least a first and a second end, said rotor ring being oriented substantially coaxially with and axially spaced apart from said stator ring; and at least one SAW resonator electrically coupled between said first and second ends of the rotor ring, wherein neither of said ends of said stator ring are directly connected to ground, and wherein one end of the stator ring is connected to earth through a resistor the resistance of which is greater than the characteristic impedance of a signal line, and each of the rotor and stator rings having a ground plane confining electromagnetic field and reducing radiation, so as to form microstrip coupled lines.

2. A split ring coupler according to claim 1, wherein one end of the stator ring, in use, is coupled to a signal analysis means.

3. A split ring coupler according to claim 2, wherein said signal analysis means comprises a network analyser.

4. A split ring coupler according to claim 1, wherein one end of the stator ring, in use, is coupled to a stationary interrogator.

5. A split ring coupler according to claim 1, wherein the ground plane associated with the rotor ring is located on the side of the rotor ring remote from the stator ring; and the ground plane associated with the stator ring is located on the side of the stator ring remote from the rotor ring.

6. A split ring coupler according to claim 1, wherein one end of the stator ring is an open circuit.

7. A split ring coupler according to claim 1, wherein the at least one SAW resonator is connected in series with said first and second ends of the rotor ring.

8. A split ring coupler according to claim 1, wherein a plurality of SAW resonators are electrically coupled between the first and second ends of the rotor ring.

9. A split ring coupler according to claim 8, wherein the plurality of SAW resonators are connected in parallel, and wherein the plurality of SAW resonators are connected in series with the first and second ends of the rotor ring.

10. A split ring coupler according to claim 8, wherein the plurality of SAW resonators are connected in series, and wherein the plurality of SAW resonators are connected in series with the first and second ends of the rotor ring.

11. A split ring coupler according to claim 8, wherein at least two of the plurality of SAW resonators are connected in series, wherein at least two of the plurality of SAW resonators are connected in parallel, and wherein the plurality of SAW resonators are connected in series with the first and second ends of the rotor ring.

12. A split ring coupler comprising:

a stator ring having at least one split in it such that the stator has at least a first and a second end; a rotor ring having two splits which divide the rotor ring into two substantially semi-circular arcuate sections, each end of each arcuate section being associated with a neighboring end of the other arcuate section, said rotor ring being oriented substantially coaxially with and axially spaced from said stator ring; and at least one SAW resonator electrically coupled between each pair of associated ends of the rotor ring, wherein neither of said ends of said stator ring are directly connected to ground, and each of the rotor and stator rings having a ground plane confining electromagnetic field and reducing radiation, so as to form microstrip coupled lines.

13. A split ring coupler according to claim 12, wherein the rotor ring includes a plurality of splits which divide it into a plurality of arcuate sections, each end of each arcuate section being associated with the neighboring end of the neighboring arcuate section.

14. A split ring coupler according to claim 12, wherein one end of the stator ring, in use, is coupled to a stationary interrogator.

15. A split ring coupler according to claim 12, wherein each SAW resonator is connected in series with the arcuate sections of the rotor ring.

16. A split ring coupler according to claim 12, wherein a plurality of SAW resonators are connected between each pair of associated ends of the rotor ring, each resonator being connected in series with said arcuate sections of the rotor ring.

17. A split ring coupler according to claim 16, wherein said SAW resonators are connected in series with each other.

18. A split ring coupler according to claim 16, where said SAW resonators are connected in parallel with each other.

19. A split ring coupler according to claim 16, wherein said SAW resonators include resonators connected in series with each other and in parallel with other resonators.

20. A split ring coupler according to claim 12, wherein:

the ground plane associated with the rotor ring is located on the side of the rotor ring remote from the stator ring; and the ground plane associated with the stator ring is located on the side of the stator ring remote from the rotor ring.

* * * * *